United States Patent
Fujiwara

(10) Patent No.: US 6,844,559 B2
(45) Date of Patent: Jan. 18, 2005

(54) APPARATUS AND METHOD FOR TESTING SUBSTRATE

(75) Inventor: Tadayuki Fujiwara, Hachioji (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 10/673,820

(22) Filed: Sep. 29, 2003

(65) Prior Publication Data

US 2004/0079897 A1 Apr. 29, 2004

(30) Foreign Application Priority Data

Oct. 11, 2002 (JP) ...................................... 2002-298623

(51) Int. Cl.[7] ............................................. H01J 37/302
(52) U.S. Cl. ............................... 250/491.1; 250/492.22
(58) Field of Search ......................... 250/491.1, 492.22, 250/492.2, 492.21, 492.3; 430/5, 296

(56) References Cited

U.S. PATENT DOCUMENTS

| | | | | |
|---|---|---|---|---|
| 5,821,550 A | * | 10/1998 | Yamashita | 250/492.22 |
| 6,242,751 B1 | * | 6/2001 | Takemoto et al. | 250/492.22 |
| 6,433,872 B1 | * | 8/2002 | Nishi et al. | 356/400 |
| 6,490,025 B1 | * | 12/2002 | Makinouchi et al. | 355/53 |
| 6,566,662 B1 | * | 5/2003 | Murakami et al. | 250/492.1 |
| 2004/0174182 A1 | * | 9/2004 | Toro-Lira et al. | 324/770 |

* cited by examiner

Primary Examiner—John R. Lee
Assistant Examiner—Johnnie L Smith, II
(74) Attorney, Agent, or Firm—Rankin, Hill, Porter & Clark, LLP

(57) ABSTRACT

A substrate testing apparatus for testing a substrate by irradiation of electron beam comprises a scan parameter calculating unit, a stage control unit for controlling the movement of a stage, and an electron beam control unit for controlling an irradiating position of electron beam. The scan parameter calculating unit calculates a stage speed and the irradiating position of electron beam on the basis of an array of measurement points in a unit area set for each substrate species of object to be tested. The scan parameters for the substrate species are automatically calculated, and the driving of the testing apparatus is controlled in accordance with the calculated parameters, whereby it is unnecessary to restart the software.

13 Claims, 5 Drawing Sheets

FIG. 4

| SUBSTRATE SPECIES | ARRAY OF MEASUREMENT POINTS |
|---|---|
| SUBSTRATE A | 900 x 20 |
| SUBSTRATE B | 320 x 60 |
| ⋮ | ⋮ |

APPARATUS AND METHOD FOR TESTING SUBSTRATE

BACKGROUND OF THE INVENTION

1. Field of the Invention

The present invention relates to an apparatus and method for testing a substrate, and more particularly to a substrate testing apparatus and method for testing a liquid crystal substrate employing an electron beam radiated from an electron gun.

2. Description of the Related Art

A substrate testing apparatus for testing a substrate is well known in which the substrate is tested by applying an electron beam from the electron gun to an object to be tested such as a liquid crystal substrate and detecting the X rays, secondary electrons or reflected electrons emitted from the substrate.

To apply electron beam onto the substrate, a range of the substrate for which the testing is performed is divided into a plurality of unit areas, in which the measurement is made for each unit area. In each unit area, the measurement is made by sequentially scanning electron beam over a predetermined number of measurement points. For the liquid crystal substrate, the unit area is set in a size of 45 mm×3 mm, for example.

The array of measurement points and the number of measurement points set in the unit area may differ depending on the object to be measured. For example, 900×20 or 320×60 measurement points are arranged for the unit area of 45 mm×3 mm.

FIGS. 5A and 5B are views for explaining the array of measurement points in the unit area.

FIG. 5A shows an example of the array of 900×20 measurement points. Substrate A is divided into unit areas of 45 mm×3 mm, each unit area having 900 points along a width of 45 mm and 20 points along a length of 3 mm, whereby measurement is made at a total of 18,000 measurement points in each unit area by applying electron beam to each measurement point.

FIG. 5B shows an example of the array of 320×60 measurement points. Substrate B is divided into unit areas of 45 mm×3 mm, like substrate A, each unit area having 320 points along a width of 45 mm and 60 points along a length of 3 mm, whereby measurement is made at a total of 19,200 measurement points in each unit area by applying electron beam to each measurement point.

In FIGS. 5A and 5B, an aspect ratio of unit area is not shown to be consistent with the ratio of 45 mm×3 mm for the simpler explanation.

To measure the unit areas of this liquid crystal substrate using the substrate testing apparatus, it is necessary to apply electron beam at each of the coordinate positions corresponding to the array of measurement points by scanning electron beam in one direction (e.g., x direction) while moving the liquid crystal substrate in the other direction (e.g., y direction) by driving the stage.

Since the array of measurement points in the unit area differs depending on the liquid crystal substrate species, it is required that the moving speed of the stage and the irradiating position of electron beam are varied for each liquid crystal substrate species to control the drive. Therefore, every time the liquid crystal substrate species which is an object to be tested is changed, it is necessary to change the scan parameters such as the stage speed and the irradiating position of electron beam.

In the related-art substrate testing apparatus, every time the liquid crystal substrate species which is an object to be tested is changed, the scan parameters of a control program for controlling the testing apparatus are changed, and the software for driving the apparatus is restarted after changing the scan parameters.

In the related-art substrate testing apparatus, because the stage speed and the irradiating position of electron beam are set as the scan parameters for the control program, to change the stage speed and the irradiating position of electron beam, it is required to change the scan parameters and restart the apparatus after changing the parameters, resulting in a problem in respect of the operability and the measurement time.

SUMMARY OF THE INVENTION

Thus, it is an object of the invention to provide a substrate testing apparatus and method which can make it unnecessary to restart the software for driving the apparatus in changing the substrate species.

In the present invention, the scan parameters for the substrate species are automatically calculated, and the driving of the testing apparatus is controlled in accordance with the calculated parameters, whereby it is unnecessary to restart the software.

This invention provides an apparatus for testing a substrate by irradiation of electron beam, comprising a scan parameter calculating unit for calculating a stage speed and an irradiating position of electron beam on the basis of an array of measurement points in a unit area set for each substrate species which is an object to be tested, a stage control unit for controlling the movement of a stage, and an electron beam control unit for controlling the irradiating position of electron beam. The stage speed is a speed of the stage for supporting and moving the substrate disposed thereon.

The stage control unit drives the stage at a calculated stage speed. Also, the electron beam control unit controls a calculated irradiating position of electron beam in synchronism with the operation of the stage.

With the substrate testing apparatus of this invention, the stage speed and the irradiating position of electron beam are calculated in accordance with the substrate species, and the stage control unit and the electron beam control unit are driven on the basis of the calculated values, whereby the substrate test is allowed without restarting the software even when the substrate species is changed.

Also, the substrate testing apparatus of the invention may further comprise a measurement point acquiring unit for acquiring the array of measurement points in the unit area on the basis of the substrate species information set for each substrate species. The substrate species information is set for each substrate species. The measurement point acquiring unit acquires the substrate species information for the substrate which is an object to be tested and acquires the array of measurement points in the unit area.

The substrate species information may be the array of measurement points in the unit area or the substrate species for designating the type of substrate.

If the substrate species information is the array of measurement points in the unit area, and the array of measurement points is set for each substrate species, the measurement point acquiring unit can directly acquire the array of measurement points.

Also, if the substrate species information is the substrate species for designating the type of substrate and the correspondence relation data between the substrate species and the array of measurement points is provided, the measurement point acquiring unit acquires the array of measurement points by reading the corresponding array of measurement points from the input substrate species.

BRIEF DESCRIPTION OF THE DRAWINGS

FIG. 4 is a table showing an example of the substrate species information of the invention.

DETAILED DESCRIPTION OF THE INVENTION

Figure 1:
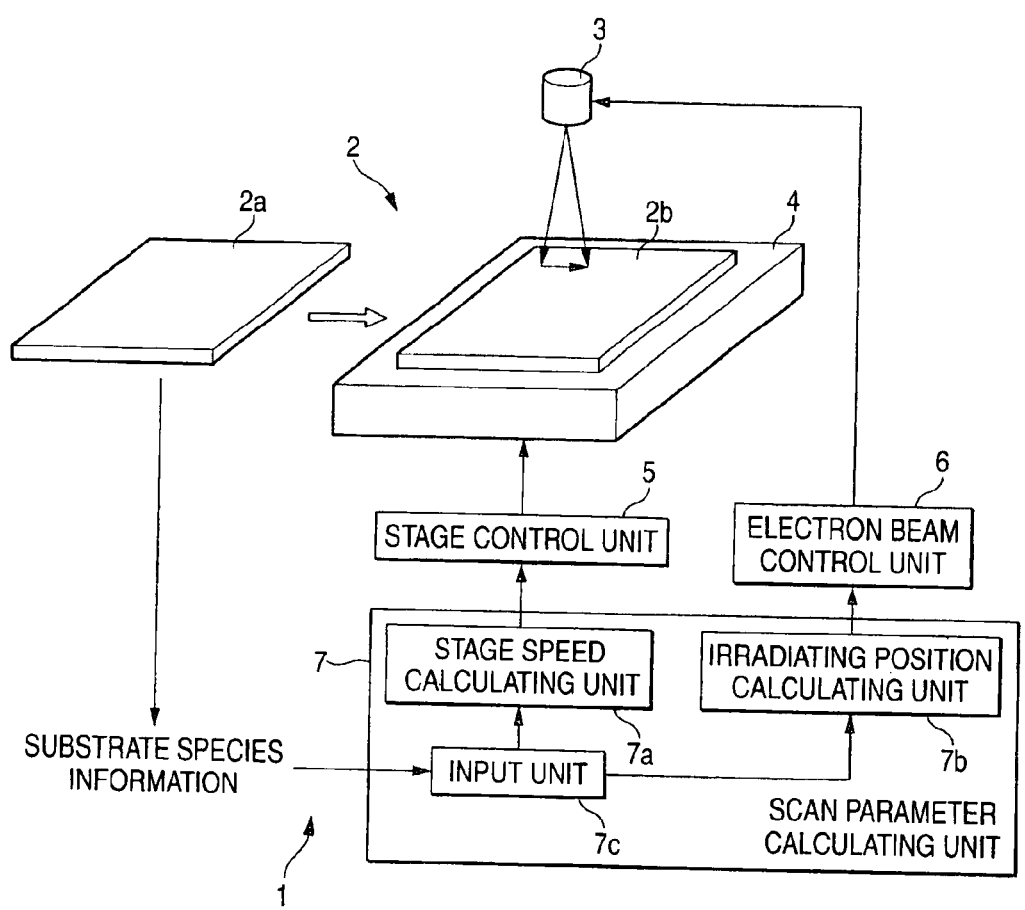
FIG. 1 is a schematic block diagram for explaining a substrate testing apparatus of the present invention.

The preferred embodiments of the present invention will be described below with reference to the accompanying drawings. FIG. 1 is a schematic block diagram for explaining a substrate testing apparatus of the invention. In FIG. 1, the substrate testing apparatus 1 comprises an electron beam gun 3 for radiating electron beam, a stage 4 for supporting and moving a substrate 2b disposed thereon, a stage control unit 5 for controlling the driving of the stage 4, an electron beam control unit 6 for controlling electron beam from the electron beam gun 3, and a scan parameter calculating unit 7.

A substrate 2a which is an object to be tested is placed on the stage 4 of the substrate testing apparatus 1 by a conveyor (not shown). The substrate 2b disposed on the stage 4 is irradiated by electron beam from the electron beam gun 3. Secondary electrons or reflected electrons are emitted from the measurement points of the substrate 2b irradiated by the electron beam. By detecting electrons emitted from the measurement points using a detector (not shown), the measurement points of the substrate 2b are tested. Herein, using a combined operation of moving the stage 4 and scanning the electron beam, a plurality of measurement points on the substrate 2b are tested by scanning the electron beam.

Figure 5B:
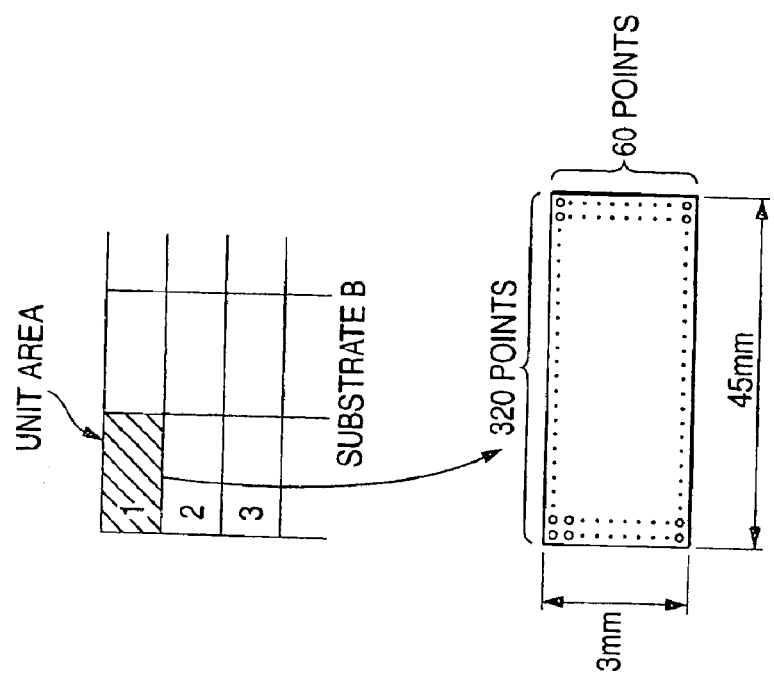
FIGS. 5A and 5B are views for explaining an array of measurement points in a unit area.
Figure 5A:
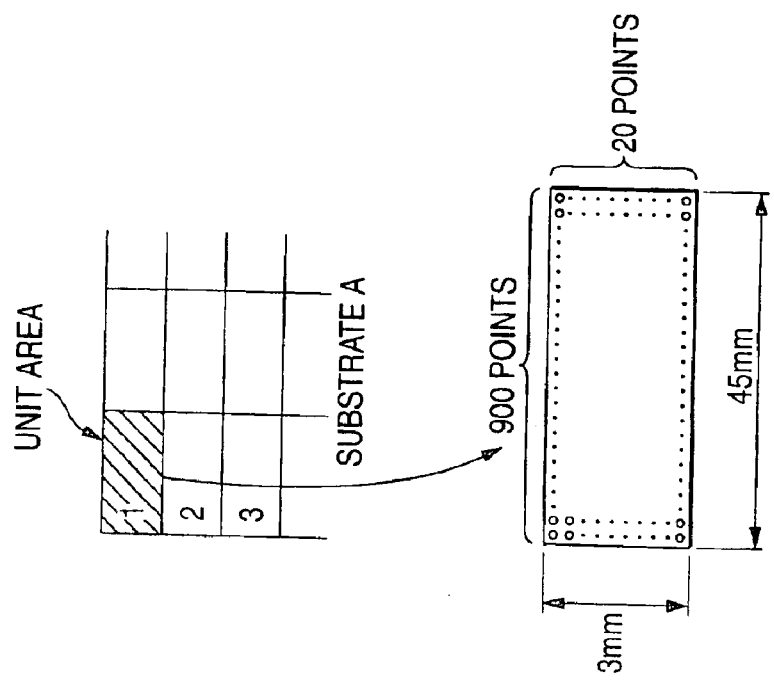

The scanning of electron beam on the substrate 2b is performed over the entire test area composed of unit areas as shown in FIGS. 5A and 5B, whereby the test area of the substrate is tested.

The array of measurement points set in unit area differs depending on the substrate species, as shown in FIGS. 5A and 5B, in which the 900×20 measurement points as shown in FIG. 5A or 320×60 measurement points as shown in FIG. 5B are arranged in a unit area of 45 mm×3 mm.

The scanning of electron beam in the unit area of the substrate is made by moving the stage 4 and scanning the electron beam in combination. Herein, as one example, in the unit area of FIGS. 5A and 5B, the movement of electron beam is made in the longitudinal direction (length of 3 mm) by moving the stage 4 and in the transverse direction (width of 45 mm) by scanning the electron beam with the electron beam gun 3.

The stage 4 is driven in the longitudinal direction (length of 3 mm) in the unit area at a constant speed to move the substrate 2b. Meanwhile, the electron beam gun 3 reciprocatively scans the electron beam in the transverse direction (width of 45 mm) in the unit area, synchronously with the driving of the stage 4. The moving speed of the stage 4 and the irradiating position of electron beam are decided by the array of measurement points set in the unit area.

The control for driving the stage 4 is made by the stage control unit 5. The control of electron beam from the electron beam gun 3 is made by the electron beam control unit 6. Also, the stage speed controlled by the stage control unit 5 and the irradiating position of electron beam controlled by the electron beam control unit 6 are calculated by the scan parameter calculating unit 7.

The scan parameter calculating unit 7 comprises stage speed calculating unit 7a for calculating the stage speed of the stage control unit 5 on the basis of the input substrate species information, an irradiating position calculating unit 7b for calculating the irradiating position of electron beam by the electron beam control unit 6, and an input unit 7c for inputting the substrate species information.

The stage speed calculating unit 7a is calculated from the time taken to scan each unit area having the number of measurement points decided for each substrate species which is an object to be tested, and the movement distance. The time taken to scan each unit area is calculated mainly on the basis of the number of measurement points within the unit area and the measurement time taken per measurement point.

For example, assuming that the measurement points in the unit area (45 mm×3 mm) are 900×20 and the measurement time per measurement point is 0.0000001 sec, the stage speed u1 in the longitudinal direction (length of 3 mm) is $$u1 = 3 \text{ mm}/((900 \times 20 \times 20) \times 0.0000001 + 2 \times 0.001) \text{ sec} \quad (1)$$

$$= 78.947 \text{ mm/sec}$$

Also, assuming that the measurement points in the unit area (45 mm×3 mm) are 320×60 and the measurement time per measurement point is 0.0000001 sec, the stage speed u2 in the longitudinal direction (length of 3 mm) is $$U2 = 3 \text{ mm}/((320 \times 60 \times 20) \times 0.0000001 + 2 \times 0.001) \text{ sec} \quad (2)$$

$$= 74.257 \text{ mm/sec}$$

Herein, this stage speed is obtained by measuring the same unit area twenty times, and transferring the measurement data, in which "20" in (900×20×20) and (320×60×20) in the expressions (1) and (2) indicates twenty measurements and (2×0.001) indicates the data transfer time.

As indicated in the above example, it is required that the stage is driven at the stage speed that is varied depending on the number of measurement points in the unit area.

The stage speed calculated by the stage speed calculating unit 7a is set on the stage control unit 5, whereby the movement speed of the stage 4 is decided.

Also, it is required that the irradiating position of electron beam applied to each measurement point is decided by the array of measurement points.

The irradiating position calculating unit 7b calculates the positional coordinates for the irradiating position of electron beam on the basis of the array of measurement points in the unit area and the stage speed calculated by the stage speed calculating unit 7a. The irradiating position of electron beam depends on the stage speed, because the stage is moved at a constant stage speed, and the scan line is deviated in the moving direction of the stage, when the position of electron beam in the moving direction of the stage is not changed along with the movement of the stage.

Accordingly, to scan the electron beam on the same scan line, it is required that the irradiating position of electron beam is calculated along with the movement of the stage by the irradiating position calculating unit 7b, and changed in the moving direction of the stage on the basis of the calculated positional coordinates. At this time, the irradiating position calculating unit 7b calculates the irradiating position of electron beam in the x direction (or the traverse direction) in accordance with the array of measurement points in the unit area.

For example, when the measurement points in the unit area (45 mm×3 mm) are 900×20, assuming that the coordinates for the irradiating position at the first scan line are (1, y1), (2, y2), (3, y3), . . . , (n, yn), . . . , and (900, y900), because the stage speed u1 in the y direction is 78.947 mm/sec, the positional coordinate yn in the y direction is $$yn=78.947 \text{ (mm/sec)} \times 0.0000001 \times n \text{(sec)} \quad (3)$$

Likewise, assuming that the coordinates for the irradiating position at the second scan line are (1, y1), (2, y2), (3, y3), . . . , (n, yn), . . . , and (900, y900), the positional coordinate yn in the y direction is $$yn=78.947 \times 0.0000001 \times (n+900)+a \quad (4)$$

Note that a in the expression (4) indicates the spacing between the first and second scan lines, and is decided by the length of unit area in the longitudinal direction (3 mm in this example) and the number of rows for the array of measurement points in the longitudinal direction (20 in this example).

Likewise, assuming that the coordinates for the irradiating position at the i-th scan line are (1, y1), (2, y2), (3, y3), . . . , (n, yn), . . . , and (900, y900), the positional coordinate yn in the y direction is $$yn=78.947 \times 0.0000001 \times (n+900 \times (i-1))+a \times (i-1) \quad (5)$$

Note that a in the expressions (4) and (5) indicates the spacing between the adjacent scan lines, and is the distance decided by the length of unit area in the longitudinal direction (3 mm in this example) and the number of rows for the array of measurement points in the longitudinal direction (20 in this example).

Similarly, when the measurement points in the unit area (45 mm×3 mm) are 320×60, assuming that the coordinates for the irradiating position at the i-th scan line are (1, y1), (2, y2), (3, y3), . . . , (n, yn), . . . , and (320, y320), because the stage speed u2 in the y direction is 74.257 mm/sec, the positional coordinate yn in the y direction is $$yn=74.257 \times 0.0000001 \times (n+320 \times (i-1))+b \times (i-1) \quad (6)$$

Note that b in the expression (6) indicates the spacing between the adjacent scan lines, and is the distance decided by the length of unit area in the longitudinal direction (3 mm in this example) and the number of rows for the array of measurement points in the longitudinal direction (60 in this example).

Figure 2A:
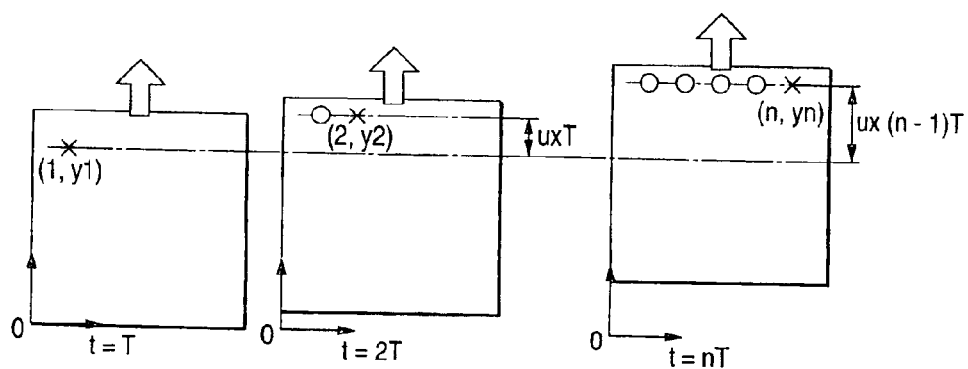
FIGS. 2A and 2B are views for explaining the relationship between the stage movement and the irradiating position of electron beam according to the invention.
Figure 2B:
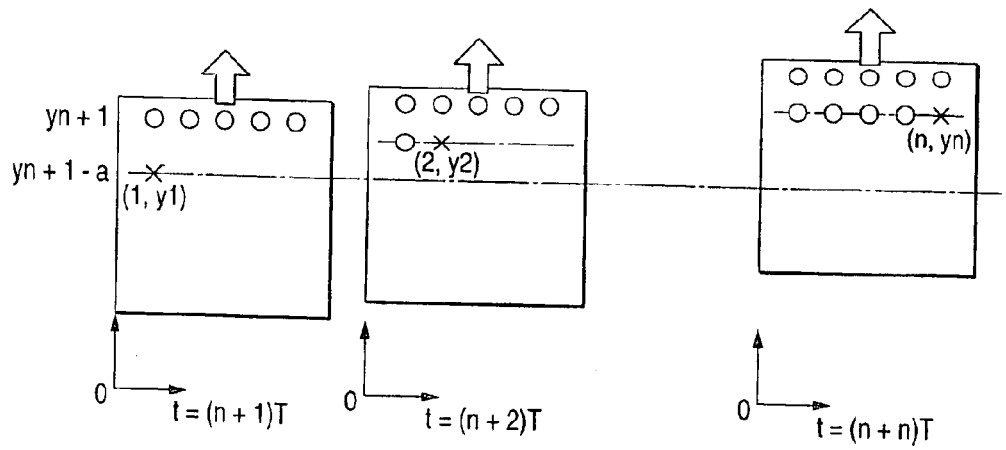
Figure 3:
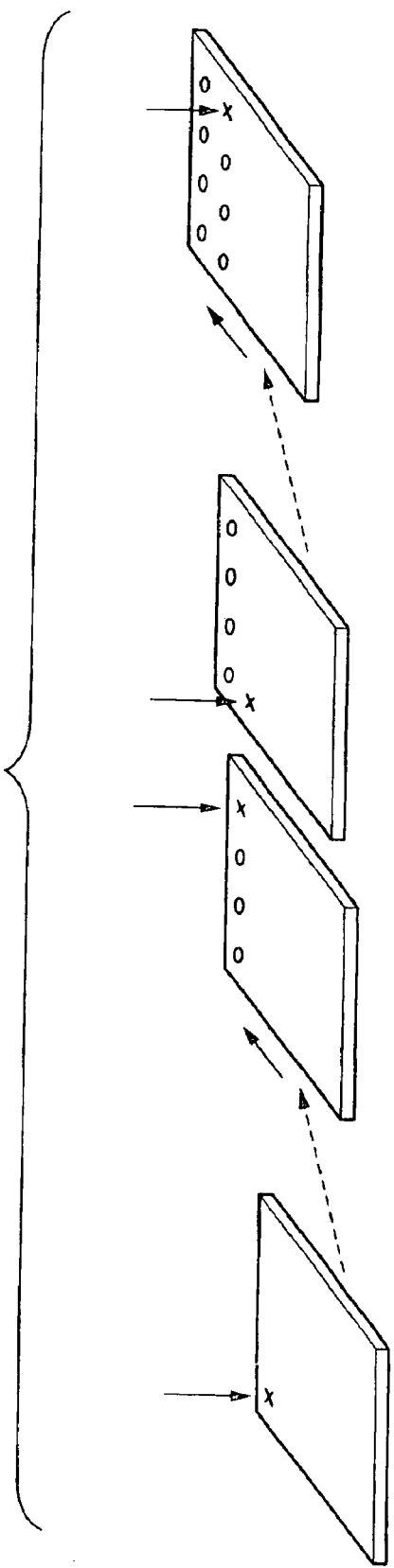
FIG. 3 is a view for explaining the relationship between the stage movement and the irradiating position of electron beam according to the invention.

FIGS. 2A, 2B and 3 are views for explaining the relationship between the stage movement and the irradiating position of electron beam. In FIG. 2, sign "x" indicates the irradiating position of electron beam at that time and sign "○" indicates the irradiating position of electron beam at the past time.

FIG. 2A shows the scanning at the first scan line. The stage is moved at a constant speed in the y direction (arrow) in the figure, and at t=T, electron beam is applied to the coordinate position (1, y1). At t=2T, because the stage is being moved at stage speed u, the position in the y direction on the same scan line as (1, y1) is shifted by u×T in the y direction. Thus, the position y2 in the y direction at the irradiating position (2, y2) of electron beam is controlled to be the position y1 in the y direction at t=T added by u×T. Similarly, at the end of the first scan line at t=nT, the position yn in the y direction at the irradiating position (n, yn) of electron beam is controlled to be the position y1 in the y direction at t=T added by u×(n−1)T.

FIG. 2B shows the scanning at the second scan line. The stage is moved at a constant speed in the y direction (arrow) in the figure. At t=(n+1)T, electron beam is controlled so that the position in the x direction is returned to "1", and the position y1 in the y direction is varied from the position y1 at t=T added by u×nT to the position yn+1+a added by a. Thereafter, the irradiating position of electron beam is controlled in the same manner as for the first scan line. Herein, a is the distance between measurement points in the y direction within the unit area.

FIG. 3 typically shows changes in the irradiating position of electron beam for the stage movement in the y direction.

The input unit 7c inputs the substrate species information of the substrate 2 which is an object to be tested, acquires the array of measurement points for the substrate, and sends the acquired information regarding the array of measurement points to the stage speed calculating unit 7a and the irradiating position calculating unit 7b.

The substrate species information maybe the information regarding the array of measurement points in the unit area, or designating the substrate species. The input unit 7c reads and inputs this substrate species information. Input of the substrate species information by the input unit 7c is made by reading the substrate species information from a recording medium provided for the substrate, or taken from a conveyor for conveying the substrate or a conveyor controller. When the substrate species information is recorded on the recording medium provided for the substrate, any recording medium such as a bar code, magnetic recording, or an IC chip may be employed. Also, when the substrate species information is taken from the conveyor or conveyor controller, the substrate species information of the substrate for use in conveying the substrate on the conveyor may be employed.

When the information designating the substrate species is input as the substrate species information, the input unit 7c reads the array of measurement points from the input substrate species information with reference to a prepared table listing the correspondence relation between the substrate species and the array of measurement points, and sends it to the stage speed calculating unit 7a or irradiating position calculating unit 7b.

FIG. 4 shows an example of the substrate species information. For example, the substrate A for the substrate species has the array of 900×20 measurement points, and the substrate B for the substrate species has the array of 320×60 measurement points.

In this embodiment of the invention, if the substrate is conveyed by the conveying unit to the substrate testing apparatus, the substrate testing apparatus acquires the substrate species information for the conveyed substrate which is an object to be tested, and controls the stage speed and the irradiating position of electron beam on the basis of this substrate species information, whereby the substrate test for different substrate species is continuously performed without restarting the program of the apparatus.

As described above, the substrate testing apparatus of the invention allows the substrate species to be changed without restarting the software for driving the apparatus.

What is claimed is:

1. An apparatus for testing a substrate by irradiation of electron beam, comprising:
   a scan parameter calculating unit for calculating a stage speed and an irradiating position of electron beam on the basis of an array of measurement points in a unit area associated with a substrate species, which is an object to be tested, the stage speed being a speed of a stage for supporting and moving the substrate disposed thereon;
   a species information input unit whereby information regarding the substrate species is collected and provided to said scan parameter calculating unit;
   a stage control unit for controlling the movement of the stage; and
   an electron beam control unit for controlling the irradiating position of electron beam,
   wherein said stage control unit drives the stage at a calculated stage speed, and said electron beam control unit controls a calculated irradiating position of electron beam in synchronism with the movement of the stage.

2. The substrate testing apparatus according to claim 1, further comprising:
   a measurement point acquiring unit for acquiring the array of measurement points in the unit area based upon the substrate species information collected by said species information input unit and for providing the array of measurement points to said scan parameter calculating unit.

3. The substrate testing apparatus according to claim 2, wherein the substrate species information is the substrate species for designating the type of substrate, and said measurement point acquiring unit acquires the array of measurement points by inputting the substrate species and referring to the correspondence relation data between the substrate species and the array of measurement points to acquire the corresponding array of measurement points.

4. A method for testing a substrate by irradiation of electron beam, comprising:
   collecting information regarding a particular substrate species to which the substrate belongs;
   calculating a stage speed and an irradiating position of electron beam on the basis of an array of measurement points in a unit area which is set for each substrate species, the stage speed being a speed of a stage for supporting and moving the substrate disposed thereon;
   driving the stage at a calculated stage speed;
   and controlling a calculated irradiating position of electron beam in synchronism with the movement of said stage.

5. The substrate testing method according to claim 4, further comprising:
   acquiring the array of measurement points in the unit area based upon the substrate species information collected regarding the particular substrate species.

6. The substrate testing method according to claim 5, wherein the acquiring step includes acquiring the array of measurement points by inputting the substrate species and referring to the correspondence relation data between the substrate species and the array of measurement points to acquire the corresponding array of measurement points.

7. The substrate testing apparatus according to claim 2 wherein the substrate species information is stored on a recording medium provided for the substrate.

8. The substrate testing apparatus according to claim 7 wherein the recording medium is selected from a group consisting of a bar code, a magnetic recording and an IC chip.

9. The substrate testing apparatus according to claim 1, wherein the substrate species information is the substrate species for designating the type of substrate, and said measurement point acquiring unit acquires the array of measurement points by inputting the substrate species and referring to the correspondence relation data between the substrate species and the array of measurement points to acquire the corresponding array of measurement points.

10. The substrate testing method according to claim 5, wherein the acquiring step includes acquiring the array of measurement points by directly inputting the array of measurement points.

11. The substrate testing apparatus according to claim 2, wherein the substrate species information is stored on a recording medium provided on one of the substrate, a conveyor for conveying the substrate, and a conveyor controller.

12. The substrate testing apparatus according to claim 11, wherein the recording medium is selected from a group consisting of a bar code, a magnetic recording and an IC chip.

13. The substrate testing apparatus according to claim 2, wherein the substrate species information is the array of measurement points in the unit area, and said measurement point acquiring unit acquires the array of measurement points by directly inputting the array of measurement points.

* * * * *